(12) United States Patent
Muraoka et al.

(10) Patent No.: US 11,994,889 B2
(45) Date of Patent: May 28, 2024

(54) OVERCURRENT PROTECTION CIRCUIT, SWITCH DEVICE, ELECTRONIC APPARATUS, AND VEHICLE

(71) Applicant: ROHM Co., LTD., Kyoto (JP)

(72) Inventors: Kenji Muraoka, Kyoto (JP); Toru Takuma, Kyoto (JP)

(73) Assignee: ROMM Co., LTD., Kyoto (JP)

( * ) Notice: Subject to any disclaimer, the term of this patent is extended or adjusted under 35 U.S.C. 154(b) by 247 days.

(21) Appl. No.: 17/655,854

(22) Filed: Mar. 22, 2022

(65) Prior Publication Data

US 2022/0308612 A1 Sep. 29, 2022

(30) Foreign Application Priority Data

Mar. 24, 2021 (JP) ................... 2021-049581

(51) Int. Cl.
| | |
|---|---|
| *G05F 1/573* | (2006.01) |
| *B60R 16/02* | (2006.01) |
| *H02H 3/08* | (2006.01) |
| *H03K 17/081* | (2006.01) |
| *H03K 19/003* | (2006.01) |

(52) U.S. Cl.
CPC .............. *G05F 1/573* (2013.01); *B60R 16/02* (2013.01); *H02H 3/08* (2013.01); *H03K 17/08104* (2013.01); *H03K 19/00315* (2013.01)

(58) Field of Classification Search
CPC ..... G05F 1/573; H02H 3/08; H03K 17/08104
See application file for complete search history.

(56) References Cited

U.S. PATENT DOCUMENTS

| | | | | |
|---|---|---|---|---|
| 8,896,270 B2 * | 11/2014 | Tanaka | ................ | H02J 7/0029 |
| | | | | 320/136 |
| 2010/0014203 A1* | 1/2010 | Teggatz | ............ | G01R 31/3835 |
| | | | | 361/91.1 |

FOREIGN PATENT DOCUMENTS

WO   WO2017187785   12/2018

* cited by examiner

*Primary Examiner* — Jue Zhang
*Assistant Examiner* — Afework S Demisse
(74) *Attorney, Agent, or Firm* — CHIP LAW GROUP

(57) ABSTRACT

Provided is an overcurrent protection circuit including an overcurrent detection unit configured to compare an output current flowing through a switch element and a predetermined overcurrent detection value to generate an overcurrent detection signal, an output activation detection unit configured to compare an output voltage and a predetermined threshold voltage to generate an output activation detection signal, a logic unit configured to combine the overcurrent detection signal and the output activation detection signal to generate a logic operation signal, and a diagnostic output unit configured to provide diagnostic output, the logic unit shifting the logic operation signal to a logic level of abnormal state when the overcurrent detection signal is shifted to a logic level of overcurrent detection state and holding the logic operation signal at that logic level, unless the output activation detection signal is shifted to a logic level of output activation state.

10 Claims, 6 Drawing Sheets

| IN | OCD (S101) | VoDET (S102) | LOGIC (S103) |
|---|---|---|---|
| L | L/H | L/H | L |
| H | L | L | HOLD |
| H | L | H | L |
| H | H | L/H | H |

OVERCURRENT PROTECTION CIRCUIT, SWITCH DEVICE, ELECTRONIC APPARATUS, AND VEHICLE

CROSS REFERENCE TO RELATED APPLICATIONS

This application claims priority benefit of Japanese Patent Application No. JP 2021-00047 filed in the Japan Patent Office on Mar. 24, 2021. Each of the above-referenced applications is hereby incorporated herein by reference in its entirety.

BACKGROUND

The technology disclosed in the present specification relates to an overcurrent protection circuit and to a switch device, an electronic apparatus, and a vehicle including the overcurrent protection circuit.

The applicant of the present application has proposed a large number of new techniques related to a switch device such as an in-vehicle intelligent power device (IPD) (see, for example, PCT Patent Publication No. WO2017/187785).

SUMMARY

However, the switch device in the related art still has room for further improvement in a diagnostic output function of an overcurrent protection circuit (abnormality notification function for outside of apparatus).

In view of the problem found out by the inventors of the present application, it is desirable to provide an overcurrent protection circuit that can provide appropriate diagnostic output and a switch device, an electronic apparatus, and a vehicle including the overcurrent protection circuit.

For example, an overcurrent protection circuit disclosed in the present specification may include an overcurrent detection unit configured to compare an output current flowing through a switch element and a predetermined overcurrent detection value to generate an overcurrent detection signal, an output activation detection unit configured to compare an output voltage appearing on one end of the switch element and a predetermined threshold voltage to generate an output activation detection signal, a logic unit configured to combine the overcurrent detection signal and the output activation detection signal to generate a logic operation signal, and a diagnostic output unit configured to provide diagnostic output based on the logic operation signal. In the overcurrent protection circuit, the logic unit shifts the logic operation signal to a logic level of abnormal state when the overcurrent detection signal is shifted to a logic level of overcurrent detection state and holds the logic operation signal at the logic level of abnormal state even when the overcurrent detection signal is subsequently shifted to a logic level of overcurrent non-detection state, unless the output activation detection signal is shifted to a logic level of output activation state.

Note that other features, elements, steps, advantages, and characteristics will become more apparent from the following detailed description of the preferred embodiments and the attached drawings related to the embodiments.

According to an embodiment of the technology disclosed in the present specification, the overcurrent protection circuit that can provide appropriate diagnostic output and the switch device, the electronic apparatus, and the vehicle including the overcurrent protection circuit can be provided.

DETAILED DESCRIPTION OF THE PREFERRED EMBODIMENTS

<Semiconductor Integrated Circuit Apparatus (Basic Configuration)>

Figure 1:
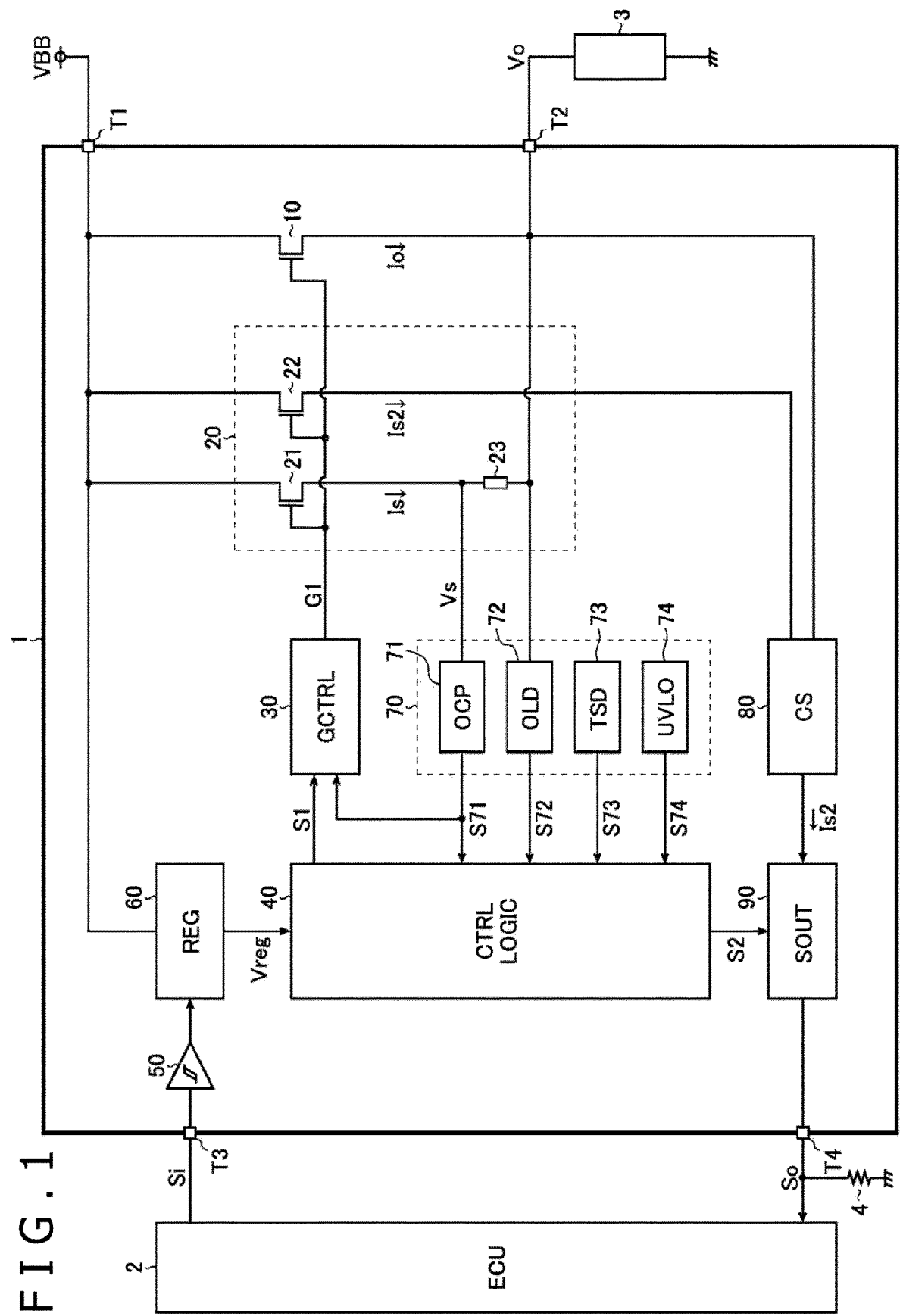
FIG. 1 depicts a basic configuration of a semiconductor integrated circuit apparatus.

FIG. 1 depicts a basic configuration of a semiconductor integrated circuit apparatus. A semiconductor integrated circuit apparatus 1 of the present configuration example is an in-vehicle high side switch large scale integration (LSI) (=type of in-vehicle IPD) that electrically connects and disconnects an application end of a power supply voltage VBB and a load 3 according to an instruction from an electronic control unit (ECU) 2.

Note that the semiconductor integrated circuit apparatus 1 includes external terminals T1 to T4 as a section for establishing electrical connection with the outside of the apparatus. The external terminal T1 is a power supply terminal (VBB pin) for receiving the power supply voltage VBB (for example, 12 V) from an unillustrated battery. The external terminal T2 is a load connection terminal or an output terminal (OUT pin) for establishing external connection for the load 3 (such as a bulb lamp, a relay coil, a solenoid, a light emitting diode, and a motor). The external terminal T3 is a signal input terminal (IN pin) for receiving external input of an external control signal Si from the ECU 2. The external terminal T4 is a signal output terminal (SENSE pin) for externally outputting a state notification signal So to the ECU 2. Note that an external sense resistor 4 is provided between the external terminal T4 and a ground end.

The semiconductor integrated circuit apparatus 1 includes integrated components including an n-type metal oxide semiconductor field effect transistor (NMOSFET) 10, an output current monitor unit 20, a gate control unit 30, a control logic unit 40, a signal input unit 50, an internal power supply unit 60, an abnormality protection unit 70, an output current detection unit 80, and a signal output unit 90.

The NMOSFET 10 is a power transistor with high breakdown voltage (for example, breakdown voltage of 42 V), in which the drain is connected to the external terminal T1 and the source is connected to the external terminal T2. The NMOSFET 10 connected in this way functions as a switch element (high side switch) for electrical connection and disconnection of a current path from the application end of the power supply voltage VBB to the ground end through the load 3. Note that the NMOSFET 10 is turned on when a gate drive signal G1 is at a high level, and the NMOSFET 10 is turned off when the gate drive signal G1 is at a low level.

The element of the NMOSFET 10 can be designed such that on-resistance Ron is several dozen mΩ. However, the lower the on-resistance Ron of the NMOSFET 10, the higher the probability of abnormal heat generation caused by a flow of overcurrent when there is a short to ground in the external terminal T2 (=abnormal short circuit to the ground end or to a low potential end equivalent to the ground end). Thus, the lower the on-resistance Ron of the NMOSFET 10, the higher the importance of an overcurrent protection circuit 71 and a temperature protection circuit 73 described later.

The output current monitor unit 20 includes NMOSFETs 21 and 22 and a sense resistor 23 and generates a sense voltage Vs (=corresponding to sense signal) according to an output current Io flowing through the NMOSFET 10.

Both of the NMOSFETs 21 and 22 are sense transistors driven in synchronization with the NMOSFET 10 and are configured to generate sense currents Is and Is2 corresponding to the output current Io. The size ratio between the NMOSFET 10 and the NMOSFETs 21 and 22 is m:1 (where m>1). Accordingly, the size of the sense currents Is and Is2 is 1/m of the output current Io. As is the case with the NMOSFET 10, the NMOSFETs 21 and 22 are turned on when the gate drive signal G1 is at a high level, and the NMOSFETs 21 and 22 are turned off when the gate voltage G1 is at a low level.

The sense resistor 23 (resistance value: Rs) is a current-voltage conversion element connected to the source of the NMOSFET 21 and the external terminal T2 and configured to generate the sense voltage Vs corresponding to the sense current Is (=Is ×Rs+Vo, where Vo represents the output voltage appearing on the external terminal T2).

The gate control unit 30 increases the current capability of a gate control signal S1 to generate the gate drive signal G1 and outputs the gate drive signal G1 to the gate of the NMOSFET 10 (and the NMOSFETs 21 and 22) to thereby control on/off of the NMOSFET 10. Note that the gate control unit 30 has a function of controlling the NMOSFET 10 to restrict the output current Io according to an overcurrent protection signal S71.

The control logic unit 40 receives an internal power supply voltage Vreg and generates the gate control signal S1. For example, the internal power supply voltage Vreg is supplied from the internal power supply unit 60 when the external control signal Si is at a high level (=logic level for turning on the NMOSFET 10). Thus, the control logic unit 40 enters an operation state, and the gate control signal S1 is shifted to a high level (=Vreg). On the other hand, the internal power supply voltage Vreg is not supplied from the internal power supply unit 60 when the external control signal Si is at a low level (=logic level for turning off the NMOSFET 10). Thus, the control logic unit 40 enters a non-operation state, and the gate control signal S1 is shifted to a low level (=GND). The control logic unit 40 also monitors various abnormality protection signals (overcurrent protection signal S71, open protection signal S72, temperature protection signal S73, and reduced voltage protection signal S74). Note that the control logic unit 40 also has a function of generating an output switch signal S2 according to monitoring results of the overcurrent protection signal S71, the open protection signal S72, and the temperature protection signal S73 among the abnormality protection signals.

The signal input unit 50 is a Schmitt trigger that receives input of the external control signal Si from the external terminal T3 and transmits the external control signal Si to the control logic unit 40 and the internal power supply unit 60. Note that the external control signal Si is, for example, shifted to a high level to turn on the NMOSFET 10 and shifted to a low level to turn off the NMOSFET 10.

The internal power supply unit 60 generates a predetermined internal power supply voltage Vreg from the power supply voltage VBB and supplies the internal power supply voltage Vreg to each component of the semiconductor integrated circuit apparatus 1. Note that whether or not to operate the internal power supply unit 60 is controlled according to the external control signal Si. More specifically, the internal power supply unit 60 enters an operation state when the external control signal Si is at a high level, and the internal power supply unit 60 enters a non-operation state when the external control signal Si is at a low level.

The abnormality protection unit 70 is a circuit block that detects various abnormalities of the semiconductor integrated circuit apparatus 1, and the abnormality protection unit 70 includes the overcurrent protection circuit 71, an open protection circuit 72, the temperature protection circuit 73, and a reduced voltage protection circuit 74.

The overcurrent protection circuit 71 generates the overcurrent protection signal S71 corresponding to the monitoring result of the sense voltage Vs (=whether or not there is an overcurrent abnormality in the output current Io). Note that the overcurrent protection signal S71 is shifted to a low level when an abnormality is not detected, and the overcurrent protection signal S71 is shifted to a high level when an abnormality is detected, for example.

The open protection circuit 72 generates the open protection signal S72 corresponding to the monitoring result of the output voltage Vo (=whether or not there is an open abnormality in the load 3). Note that the open protection signal S72 is shifted to a low level when an abnormality is not detected, and the open protection signal S72 is shifted to a high level when an abnormality is detected, for example.

The temperature protection circuit 73 includes a temperature detection element (not illustrated) that detects abnormal heat generation of the semiconductor integrated circuit apparatus 1 (particularly, around the NMOSFET 10) and generates the temperature protection signal S73 corresponding to the detection result (=whether or not abnormal heat is generated). Note that the temperature protection signal S73 is shifted to a low level when an abnormality is not detected, and the temperature protection signal S73 is shifted to a high level when an abnormality is detected, for example.

The reduced voltage protection circuit 74 generates the reduced voltage protection signal S74 corresponding to the monitoring result of the power supply voltage VBB or the internal power supply voltage Vreg (=whether or not there is a reduced voltage abnormality). Note that the reduced voltage protection signal S74 is shifted to a low level when an abnormality is not detected, and the reduced voltage protection signal S74 is shifted to a high level when an abnormality is detected, for example.

The output current detection unit 80 uses an unillustrated bias section to bring the source voltage of the NMOSFET 22 into line with the output voltage Vo and thereby generate the sense current Is2 corresponding to the output current Io (=Io/m) and outputs the sense current Is2 to the signal output unit 90.

The signal output unit 90 selects and outputs, to the external terminal T4, one of the sense current Is2 (=corresponding to the detection result of the output current Io) and a fixed voltage V90 (=corresponding to an abnormality flag; not illustrated in FIG. 1) in reference to the output switch signal S2. When the sense current Is2 is selected and output, an output detection voltage V80 (=Is2×R4) obtained by current-voltage conversion of the sense current Is2 performed by the external sense resistor 4 (resistance value: R4) is transmitted as the state notification signal So to the ECU 2. The larger the output current Io, the higher the output detection voltage V80. The smaller the output current Io, the lower the output detection voltage V80. On the other hand, when the fixed voltage V90 is selected and output, the fixed voltage V90 is transmitted as the state notification signal So to the ECU 2. Note that analog-to-digital (A/D) conversion can be applied to the state notification signal So to read the current value of the output current Io from the state notification signal So. On the other hand, the logic level of the state notification signal So can be determined by using a threshold slightly lower than the fixed voltage V90, to read the abnormality flag from the state notification signal So.

<Gate Control Unit>

Figure 2:
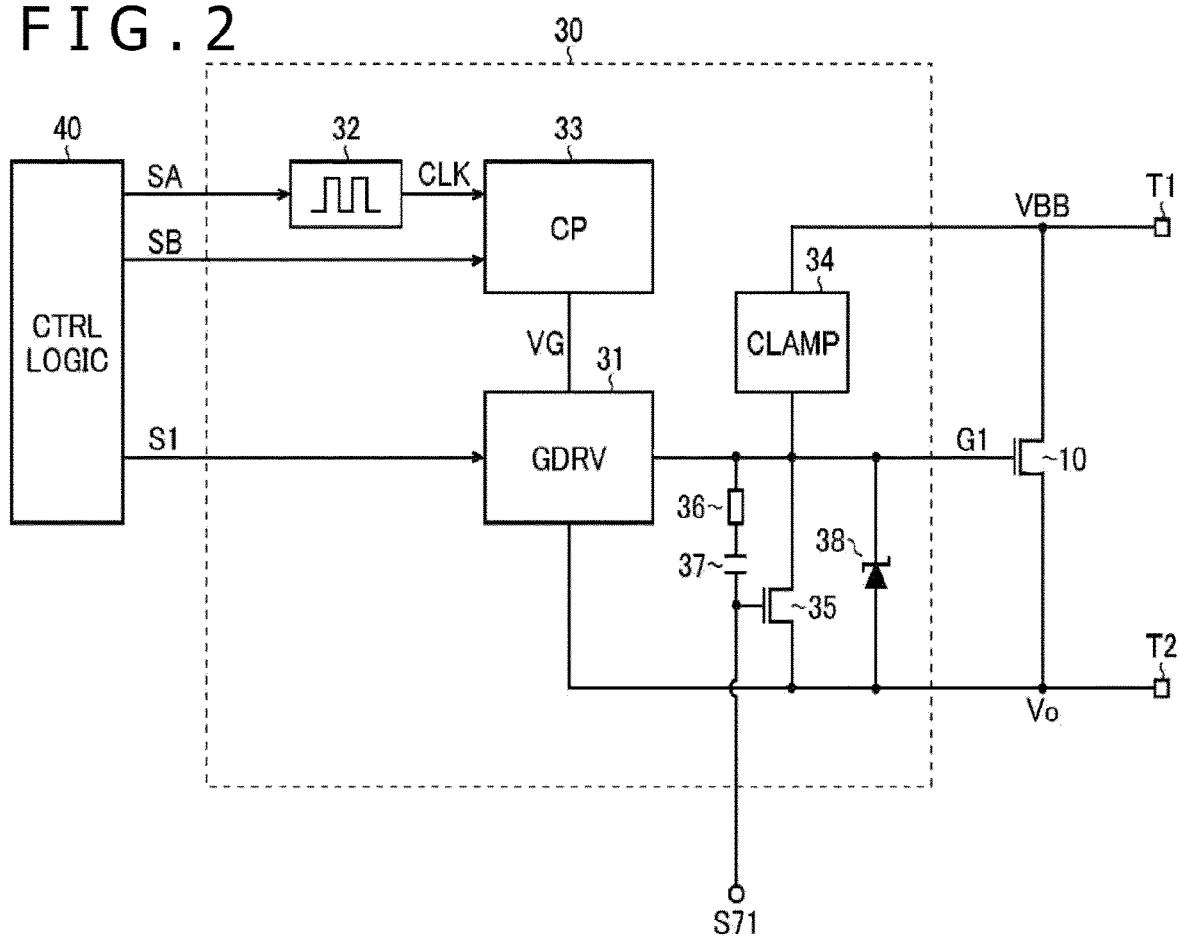
FIG. 2 depicts a configuration example of a gate control unit.

FIG. 2 depicts a configuration example of the gate control unit 30. The gate control unit 30 of FIG. 2 includes a gate driver 31, an oscillator 32, a charge pump 33, a clamper 34, an NMOSFET 35, a resistor 36 (resistance value: R36), a capacitor 37 (capacity value: C37), and a Zener diode 38.

The gate driver 31 is connected to an output end of the charge pump 33 (=application end of booster voltage VG) and the external terminal T2 (application end of output voltage Vo) and configured to increase the current capability of the gate control signal S1 to generate the gate drive signal G1. Note that the gate drive signal G1 is shifted to a high level (=VG) when the gate control signal S1 is at a high level, and the gate drive signal G1 is shifted to a low level (=Vo) when the gate control signal S1 is at a low level.

The oscillator 32 generates a clock signal CLK at a predetermined frequency and outputs the clock signal CLK to the charge pump 33. Note that whether or not to operate the oscillator 32 is controlled according to an enable signal SA from the control logic unit 40.

The charge pump 33 is an example of a booster that uses the clock signal CLK to drive a flying capacitor and thereby generate the booster voltage VG higher than the power supply voltage VBB and that supplies the booster voltage VG to the gate driver 31. Note that whether or not to operate the charge pump 33 is controlled according to an enable signal SB from the control logic unit 40.

The clamper 34 is connected to the external terminal T1 (=application end of power supply voltage VBB) and the gate of the NMOSFET 10. In an application in which an inductive load 3 is connected to the external terminal T2, the output voltage Vo becomes a negative voltage (<GND) due to the back electromotive force of the load 3 when the NMOSFET 10 is switched from on to off. Therefore, the clamper 34 (what is generally called an active clamp circuit) is provided for energy absorption.

The drain of the NMOSFET 35 is connected to the gate of the NMOSFET 10. The source of the NMOSFET 35 is connected to the external terminal T2. The gate of the NMOSFET 35 is connected to the application end of the overcurrent protection signal S71. The resistor 36 and the capacitor 37 are connected in series between the drain and the gate of the NMOSFET 35.

The cathode of the Zener diode 38 is connected to the gate of the NMOSFET 10. The anode of the Zener diode 38 is connected to the source of the NMOSFET 10. The Zener diode 38 connected in this way functions as a clamp element that restricts the voltage between the gate and the source (=VG−Vo) of the NMOSFET 10 to be equal to or smaller than a predetermined value.

When the overcurrent protection signal S71 is raised to a high level in the gate control unit 30 of the present configuration example, the gate drive signal G1 is reduced with a predetermined time constant τ (=R36×C37) from a high level (=VG) of steady state. As a result, the conductivity of the NMOSFET 10 gradually decreases, and the output current Io is restricted. On the other hand, when the overcurrent protection signal S71 is lowered to a low level, the gate drive signal G1 is increased with the predetermined time constant τ. As a result, the conductivity of the NMOSFET 10 gradually rises, and the restriction of the output current Io is released.

In this way, the gate control unit 30 of the present configuration example has a function of controlling the gate drive signal G1 to restrict the output current Io according to the overcurrent protection signal S71.

<Overcurrent Protection Circuit (Comparison Example)>

Figure 3:
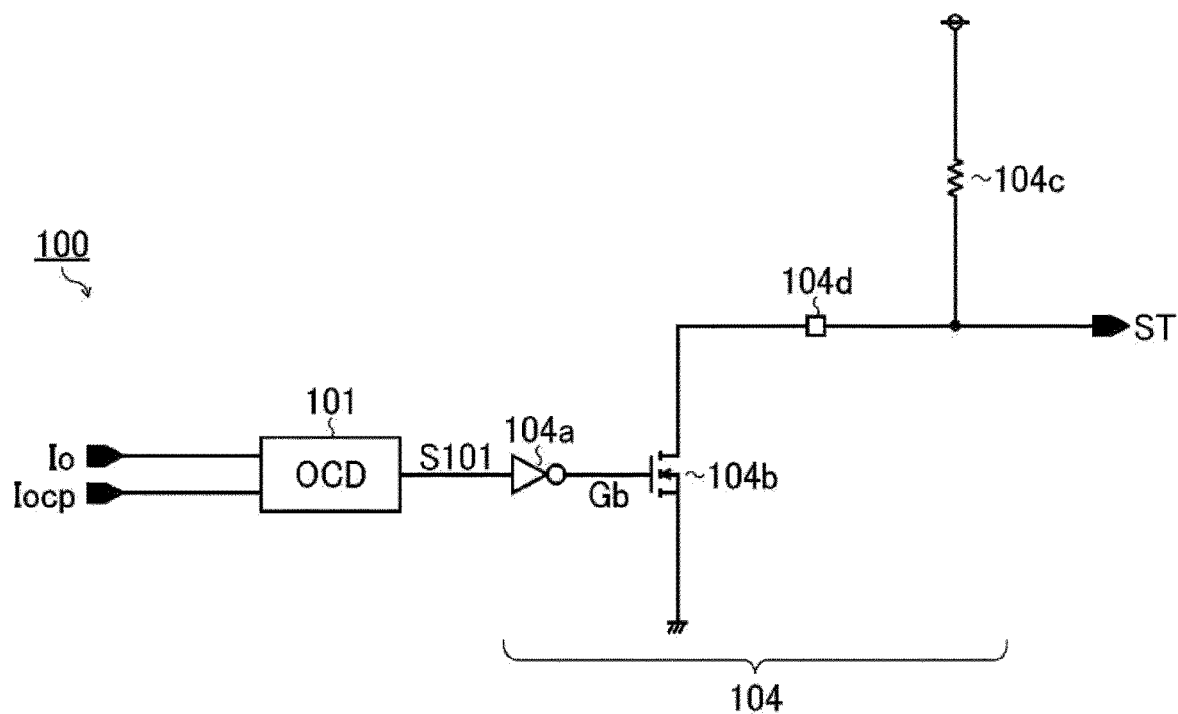
FIG. 3 depicts a comparison example of an overcurrent protection circuit.

FIG. 3 depicts a comparison example of the overcurrent protection circuit (example of a general configuration compared with a novel embodiment described later). An overcurrent protection circuit 100 of the present comparison example is a circuit block corresponding to the overcurrent protection circuit 71 described above, and the overcurrent protection circuit 100 includes an overcurrent detection unit 101 and a diagnostic output unit 104.

The overcurrent detection unit 101 compares the output current Io flowing through the NMOSFET 10 and a predetermined overcurrent detection value Iocp to generate an overcurrent detection signal S101 (corresponding to the overcurrent protection signal S71 described above). The overcurrent detection signal S101 is, for example, shifted to a high level when an overcurrent is detected (Io>Iocp) and shifted to a low level when an overcurrent is not detected (Io<Iocp). Although not illustrated in FIG. 3, the overcurrent detection signal S101 is also input to the gate control unit 30, and the gate drive signal G1 is controlled to restrict the output current Io according to the overcurrent detection signal S101.

The diagnostic output unit 104 is a signal output stage in an open drain format that provides diagnostic output to the ECU 2 in reference to the overcurrent detection signal S101, and the diagnostic output unit 104 can be understood as a circuit block replacing the signal output unit 90 or a circuit block provided along with the signal output unit 90. Note that the diagnostic output unit 104 includes, for example, an inverter 104a, an NMOSFET 104b, a resistor 104c, and an external terminal 104d.

The inverter 104a logically inverts the overcurrent detection signal S101 to generate a gate signal Gb of the NMOSFET 104b. Accordingly, the gate signal Gb is shifted to a low level when the overcurrent detection signal S101 is at a high level, and the gate signal Gb is shifted to a high level when the overcurrent detection signal S101 is at a low level.

The source of the NMOSFET 104b is connected to the ground end. The drain of the NMOSFET 104b is connected to the external terminal 104d. The gate of the NMOSFET 104b is connected to the output end of the inverter INV104a (=corresponding to the application end of the gate signal Gb). The NMOSFET 104b connected in this way is turned off when the gate signal Gb is at a low level, and turned on when the gate signal Gb is at a high level.

The resistor 104c is an external pull-up resistor provided between the external terminal 104d and the power supply end. Accordingly, a diagnostic output signal ST (=corresponding to the status flag) appearing on the external terminal 104d is at a high level (=logic level of abnormal state) when the NMOSFET 104b is turned off, and the diagnostic output signal ST is at a low level (=logic level of normal state) when the NMOSFET 104*b* is turned on. In this way, the diagnostic output signal ST is a binary signal having basically the same logic levels as the overcurrent detection signal S101.

The external terminal 104*d* is a diagnostic output terminal of the overcurrent protection circuit 100 (=corresponding to the external output terminal of the diagnostic output signal ST), and the external terminal 104*d* is connected to, for example, the ECU 2.

In this way, the semiconductor integrated circuit apparatus 1 includes the overcurrent protection circuit 100 to prevent destruction of the semiconductor integrated circuit apparatus 1 even when the output current Io is in an overcurrent state due to, for example, a short to ground in the external terminal T2.

Note that, in the overcurrent protection circuit 100 of the present comparison example, the overcurrent detection signal S101 is substantially directly output as the diagnostic output signal ST for notifying the ECU 2 of whether or not the output current Io is in the overcurrent state.

Figure 4:
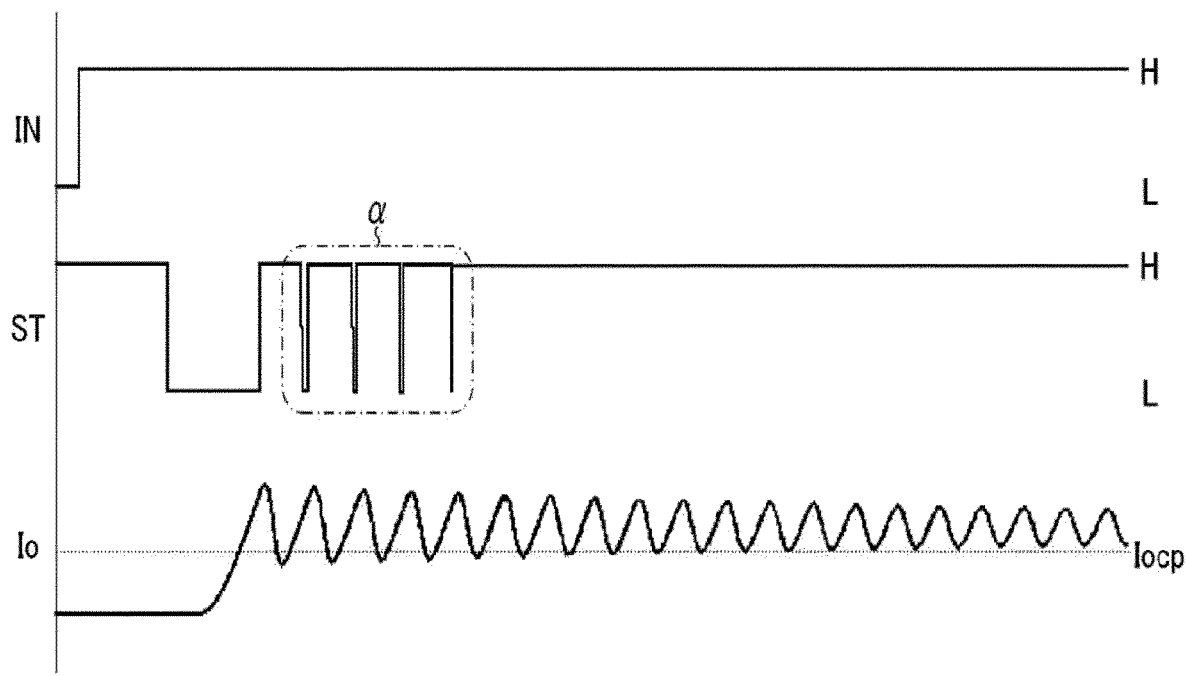
FIG. 4 depicts an example of a diagnostic output operation in the comparison example.

FIG. 4 depicts an example of a diagnostic output operation in the present comparison example. FIG. 4 depicts an input signal IN (=corresponding to the external control signal Si input to the IN pin described above), the diagnostic output signal ST, and the output current Io from the top.

The ringing of the output current Io in the overcurrent restriction state is large as illustrated in FIG. 4 when, for example, the input signal IN is raised to a high level (=logic level of on state) in a state in which there is a short to ground in the external terminal T2 (=output terminal for attaching the load 3) through, for example, a harness with large inductance components. As a result, the output current Io repetitively increases and decreases across the overcurrent detection value Iocp. Hence, the diagnostic output signal ST may be erroneously switched to a low level (=logic level of abnormal state) as indicated by a chain line frame α in FIG. 4. A novel embodiment that can solve the problem will be proposed below.

<Overcurrent Protection Circuit (Embodiment)>

Figure 5:
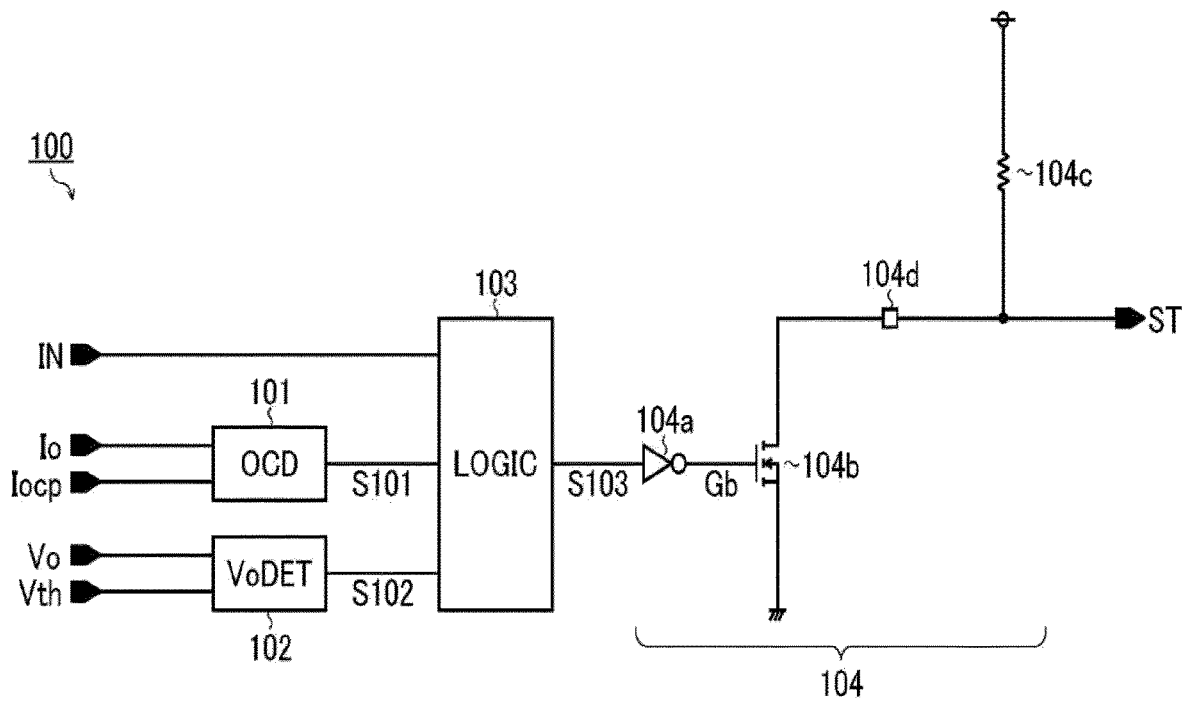
FIG. 5 depicts a novel embodiment of the overcurrent protection circuit.

FIG. 5 depicts a novel embodiment of the overcurrent protection circuit. An overcurrent protection circuit 100 of the present embodiment is based on the comparison example (FIG. 3) but further includes an output activation detection unit 102 and a logic unit 103.

The output activation detection unit 102 compares the output voltage Vo appearing on the external terminal T2 (=source of the NMOSFET 10) and a predetermined threshold voltage Vth to generate an output activation detection signal S102. The output activation detection signal S102 is, for example, shifted to a high level when the output is activated (Vo>Vth) and shifted to a low level when the output is not activated (Vo<Vth).

In this way, in the case where the external terminal T1 is a power supply terminal and the external terminal T2 is an output terminal, that is, in the case where the NMOSFET 10 is a high side switch connected to the power supply terminal and the output terminal, the output activation detection unit 102 can shift the output activation detection signal S102 to a high level (=logic level of output activation state) when the output voltage Vo appearing on the external terminal T2 (=output terminal) is higher than the threshold voltage Vth and shift the output activation detection signal S102 to a low level (=logic level of output non-activation state) when the output voltage Vo is lower than the threshold voltage Vth.

In this case, the output activation detection unit 102 can be understood as a short-to-ground detection unit that detects whether or not there is a short to ground in the external terminal T2 (=output terminal). Note that, when there is no short to ground in the external terminal T2, Vo is greater than Vth, and the output activation detection signal S102 is at a high level. On the other hand, when there is a short to ground in the external terminal T2, Vo is smaller than Vth, and the output activation detection signal S102 is at a low level.

Although not further illustrated, the overcurrent protection circuit 100 of the present embodiment can be applied not only to the high side switch integrated circuit (IC), but also to a low side switch IC. For example, assuming that the external terminal T1 is an output terminal and the external terminal T2 is a ground terminal, that is, assuming that the NMOSFET 10 is a low side switch connected to the output terminal and the ground terminal, the output activation detection unit 102 can shift the output activation detection signal S102 to a high level (=logic level of output activation state) when the output voltage Vo appearing on the external terminal T1 (=output terminal) is lower than the threshold voltage Vth and shift the output activation detection signal S102 to a low level (=logic level of output non-activation state) when the output voltage Vo is higher than the threshold voltage Vth.

In this case, the output activation detection unit 102 can be understood as a short-to-battery detection unit that detects whether or not there is a short to battery in the external terminal T1 (=output terminal). The short to battery denotes an abnormal short circuit to the power supply end or to a high potential end equivalent to the power supply end. Note that, when there is no short to battery in the external terminal T1, Vo is smaller than Vth, and the output activation detection signal S102 is shifted to a high level. On the other hand, when there is a short to battery in the external terminal T1, Vo is greater than Vth, and the output activation detection signal S102 is shifted to a low level.

The logic unit 103 combines the overcurrent detection signal S101 and the output activation detection signal S102 to generate a logic operation signal S103. For example, the logic unit 103 shifts the logic operation signal S103 to a high level (=logic level of abnormal state) when the overcurrent detection signal S101 is shifted to a high level (=logic level of overcurrent detection state) and holds the logic operation signal S103 at the high level (logic level of abnormal state) even when the overcurrent detection signal S101 is subsequently shifted to a low level (=logic level of overcurrent non-detection state), unless the output activation detection signal S102 is shifted to a high level (=logic level of output activation state).

The logic unit 103 further receives the input signal IN for turning on/off the NMOSFET 10 and shifts the logic operation signal S103 to a low level (=logic level of normal state) regardless of the overcurrent detection signal S101 and the output activation detection signal S102 when the input signal IN is at a low level (=logic level of off state).

The logic arithmetic operation of the logic unit 103 will be described in detail later.

The diagnostic output unit 104 receives input of the logic operation signal S103 from the logic unit 103 instead of the overcurrent detection signal S101 and provides diagnostic output to the ECU 2 in reference to the logic operation signal S103. Note that the circuit configuration of the diagnostic output unit 104 is the same as in the comparison example (FIG. 3), and the diagnostic output signal ST is a binary signal having basically the same logic levels as the logic operation signal S103.

Figures 6, 7:
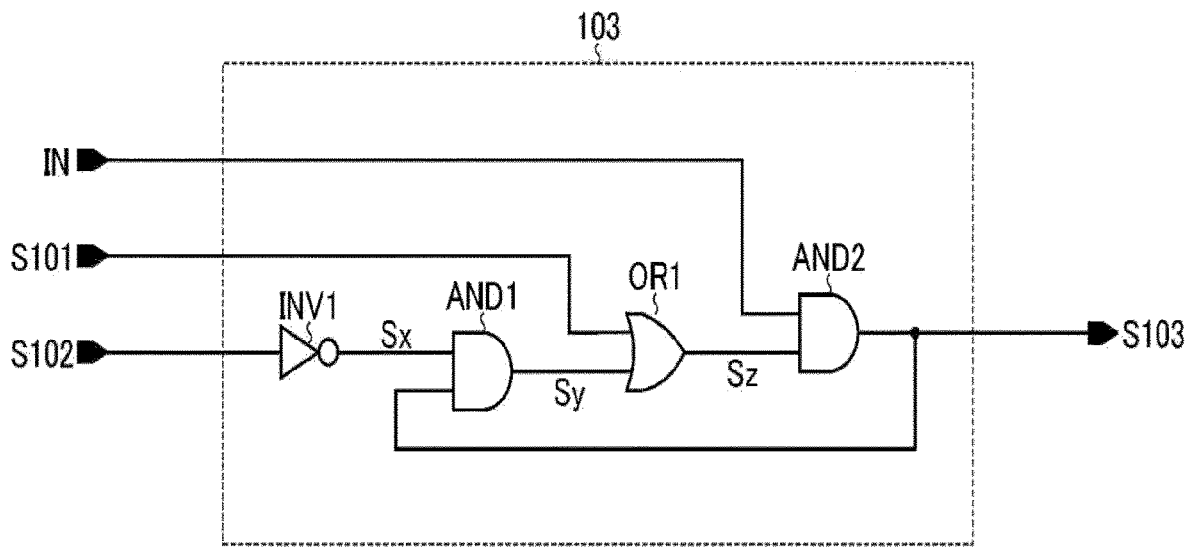
FIG. 6 depicts a configuration example of a logic unit.
FIG. 7 is a diagram (truth table) illustrating an arithmetic operation of the logic unit.

FIG. 6 depicts a configuration example of the logic unit 103. As illustrated in FIG. 6, the logic unit 103 of the present configuration example includes an inverter INV1, logic product gates AND1 and AND2, and a logic sum gate OR1.

The inverter INV1 logically inverts the output activation detection signal S102 to generate an internal signal Sx. The internal signal Sx is shifted to a low level when the output activation detection signal S102 is at a high level, and the internal signal Sx is shifted to a high level when the output activation detection signal S102 is at a low level.

The logic product gate AND1 performs an AND operation of the internal signal Sx and the logic operation signal S103 to generate an internal signal Sy. The internal signal Sy is shifted to a low level when at least one of the internal signal Sx and the logic operation signal S103 is at a low level, and the internal signal Sy is shifted to a high level when both the internal signal Sx and the logic operation signal S103 are at a high level.

The logic sum gate OR1 performs an OR operation of the overcurrent detection signal S102 and the internal signal Sy to generate an internal signal Sz. The internal signal Sz is shifted to a high level when at least one of the overcurrent detection signal S102 and the internal signal Sy is at a high level, and the internal signal Sz is shifted to a low level when both the overcurrent detection signal S102 and the internal signal Sy are at a low level.

The logic product gate AND2 performs an AND operation of the input signal IN and the internal signal Sz to generate the logic operation signal S103. The logic operation signal S103 is shifted to a low level when at least one of the input signal IN and the internal signal Sz is at a low level, and the logic operation signal S103 is shifted to a high level when both the input signal IN and the internal signal Sz are at a high level.

FIG. 7 is a diagram (truth table) illustrating an arithmetic operation of the logic unit 103, and the logic levels of each of the input signal IN, the overcurrent detection signal S101, the output activation detection signal S102, and the logic operation signal S103 are depicted from left to right.

As illustrated in the first row, the logic operation signal S103 is at a low level regardless of the overcurrent detection signal S101 and the output activation detection signal S102, when the input signal IN is at a low level.

As illustrated in the second row, the logic operation signal S103 is held at the most recent logic level when the input signal IN is at a high level and both the overcurrent detection signal S101 and the output activation detection signal S102 are at a low level.

As illustrated in the third row, the logic operation signal S103 is at a low level when the input signal IN is at a high level, the overcurrent detection signal S101 is at a low level, and the output activation detection signal S102 is at a high level.

As illustrated in the fourth row, the logic operation signal S103 is at a high level regardless of the output activation detection signal S102 when both the input signal IN and the overcurrent detection signal S101 are at a high level.

Figure 8:
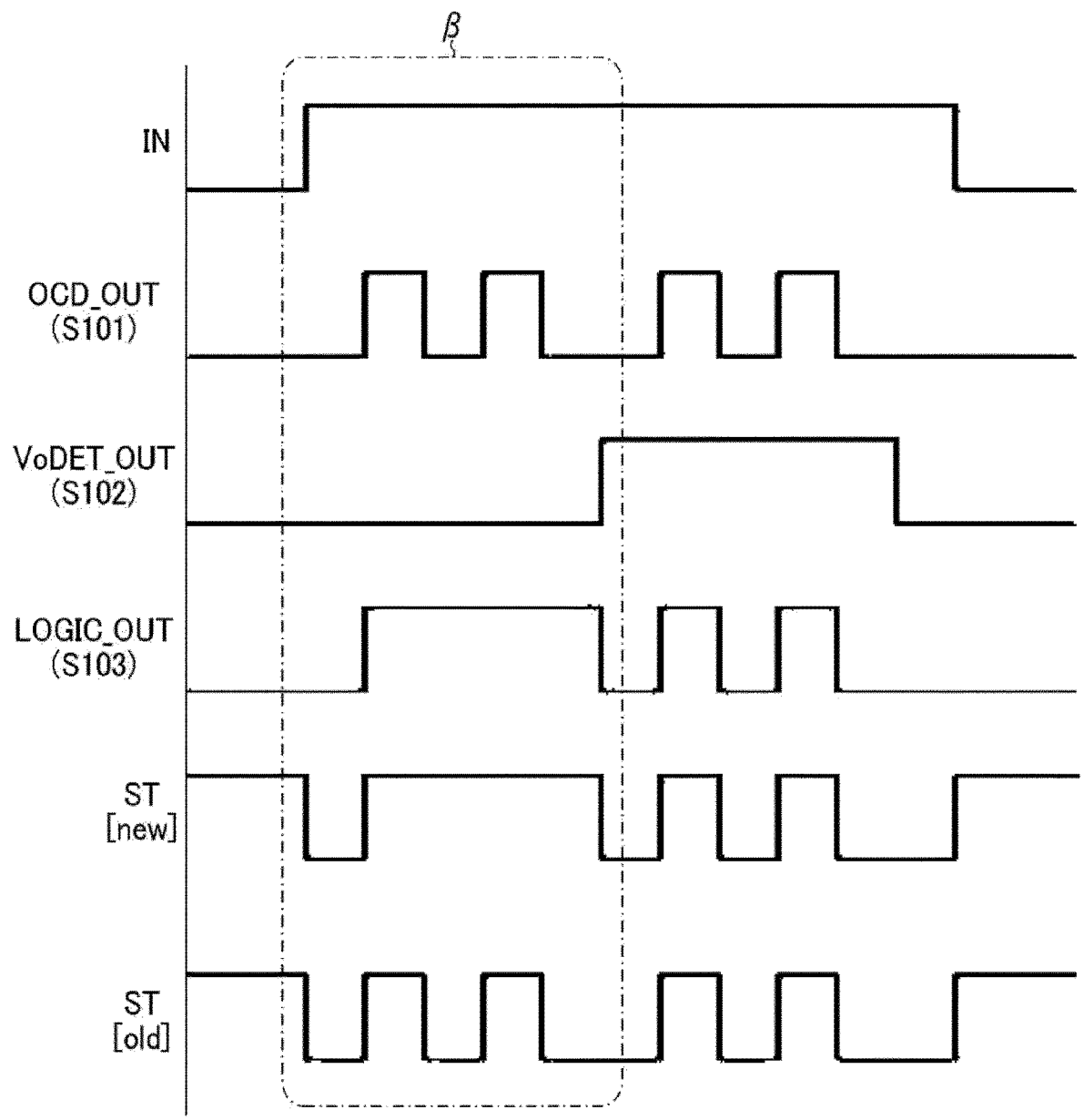
FIG. 8 is a diagram (timing chart) illustrating the arithmetic operation of the logic unit.

FIG. 8 is a diagram (timing chart) illustrating the arithmetic operation of the logic unit 103, and FIG. 8 depicts the input signal IN, the overcurrent detection signal S101, the output activation detection signal S102, the logic operation signal S103, and the diagnostic output signals ST (embodiment/comparison example) from the top.

When, for example, there is a short to ground in the external terminal T2 (=output terminal), the output voltage Vo does not exceed the threshold voltage Vth even when the input signal IN rises to a high level as indicated by a chain line frame β in FIG. 8. Thus, the output activation detection signal S102 stays at a low level. When the output current Io becomes excessive in such a state and the overcurrent detection signal S101 rises to a high level, the logic operation signal S103 is switched to a high level. Thus, the diagnostic output signal ST is also switched to a high level (corresponding to the fourth row in FIG. 7).

Subsequently, there can be a case in which the overcurrent detection signal S101 is erroneously switched to a low level (=logic level of overcurrent non-detection state) due to the ringing of the output current Io in the overcurrent restriction state. In this case, the diagnostic output signal ST also falls to a low level in synchronization with the overcurrent detection signal S101 in the comparison example as illustrated in the bottom stage of FIG. 8.

On the other hand, once the logic operation signal S103 rises to a high level in the present embodiment, the logic operation signal S103 is held at a high level (corresponding to the second row in FIG. 7) even when the overcurrent detection signal S101 is subsequently shifted to a low level, as long as the output activation detection signal S102 is at a low level (=logic level of output non-activation state, that is, logic level of short-to-ground detection state). This can prevent false reaction of the diagnostic output signal ST.

Figure 9:
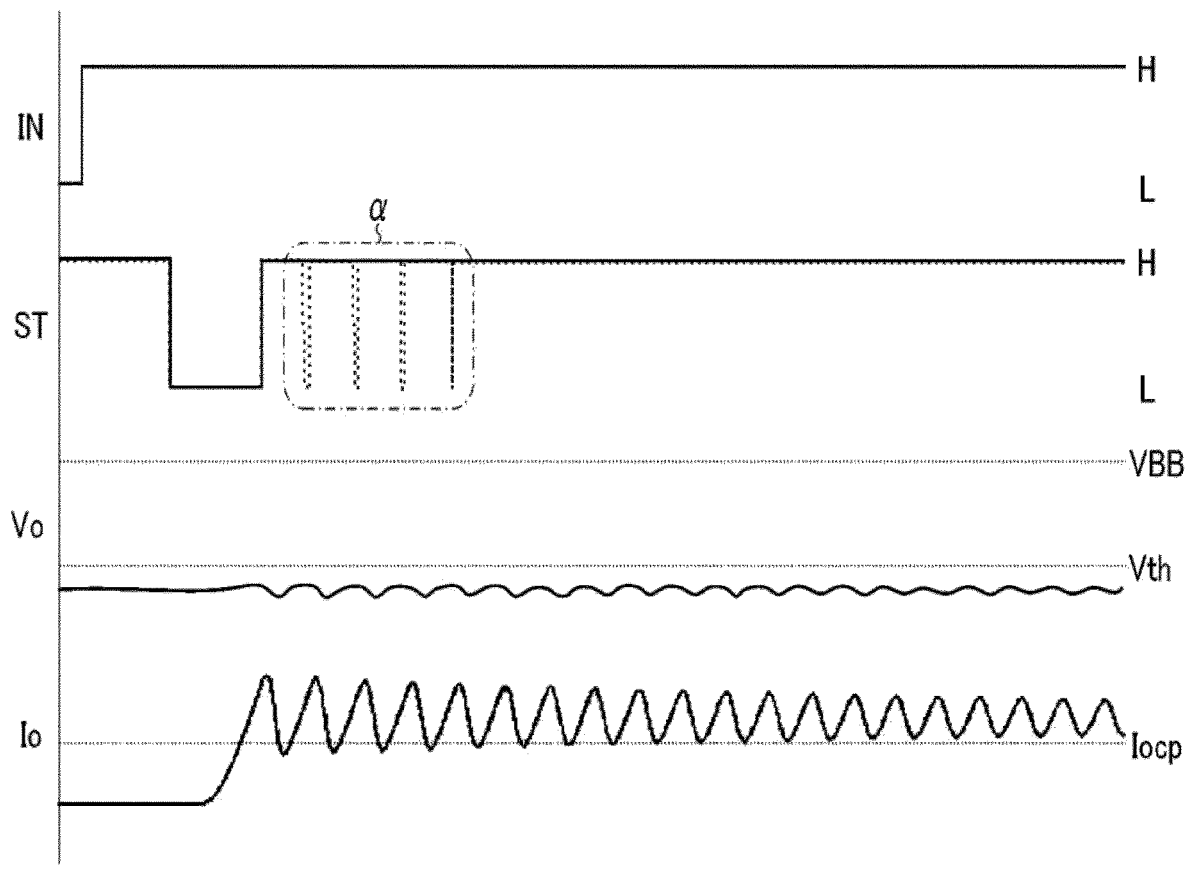
FIG. 9 depicts an example of a diagnostic output operation in the embodiment.

FIG. 9 depicts an example of the diagnostic output operation in the present embodiment, and the input signal IN (=corresponding to the external control signal Si input to the IN pin), the diagnostic output signal ST, and the output current Io are depicted from the top as in FIG. 4. Note that the dashed line of the diagnostic output signal ST is illustrated for comparison with the behavior in the comparison example (FIG. 4).

As is apparent from the comparison of the solid line (present embodiment) and the dashed line (comparison example) of the diagnostic output signal ST, the present embodiment can be adopted to hold the diagnostic output signal ST at a high level (=logic level of abnormal state) and prevent false reaction as indicated by the chain line frame α in FIG. 9 even when the output current Io repetitively increases and decreases across the overcurrent detection value Iocp due to the ringing of the output current Io in the overcurrent restriction state.

<Application to Vehicle>

Figure 10:
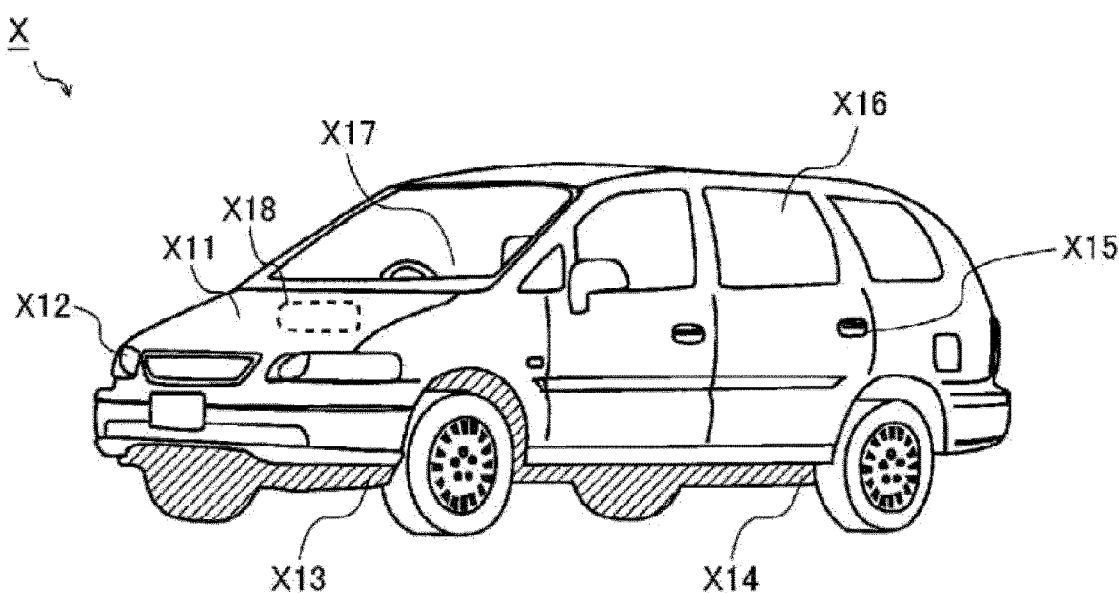
FIG. 10 is an external view illustrating a configuration example of a vehicle.

FIG. 10 is an external view illustrating a configuration example of a vehicle. A vehicle X of the present configuration example is provided with a battery (not illustrated in FIG. 10) and various electronic apparatuses X11 to X18 that receive power from the battery to operate.

Examples of the vehicle X include an engine car as well as an electric car (xEV such as battery electric vehicle (BEV), hybrid electric vehicle (HEV), plug-in hybrid electric vehicle/plug-in hybrid vehicle (PHEV/PHV), and fuel cell electric vehicle/fuel cell vehicle (FCEV/FCV)).

Note that the installation positions of the electronic apparatuses X11 to X18 in FIG. 10 may be different from the actual positions for the convenience of illustration.

The electronic apparatus X11 is an electronic control unit that performs control related to engine (such as injection control, electronic throttle control, idling control, oxygen sensor heater control, and auto cruise control) or control related to motor (such as torque control and power regeneration control).

The electronic apparatus X12 is a lamp control unit that performs light on/off control of high intensity discharged lamp (HID), daytime running lamp (DRL), and the like.

The electronic apparatus X13 is a transmission control unit that performs control related to transmission.

The electronic apparatus X14 is a body control unit that performs control related to motion of the vehicle X (such as anti-lock brake system (ABS) control, electric power steering (EPS) control, and electronic suspension control).

The electronic apparatus X15 is a security control unit that controls drive of a door lock, a security alarm, and the like.

The electronic apparatus X16 is an electronic apparatus incorporated into the vehicle X at factory shipment as standard equipment or a manufacturer option, such as a wiper, an electric door mirror, a power window, a damper (shock absorber), an electric sunroof, and an electric seat.

The electronic apparatus X17 is an electronic apparatus optionally mounted on the vehicle X as a user option, such as an in-vehicle audio/visual (A/V) device, a car navigation system, and an electronic toll collection (ETC) system.

The electronic apparatus X18 is an electronic apparatus including a high breakdown voltage motor, such as an in-vehicle blower, an oil pump, a water pump, and a battery cooling fan.

Note that the semiconductor integrated circuit apparatus 1, the ECU 2, and the load 3 can be incorporated into any of the electronic apparatuses X11 to X18.

Summarization

A summary of various embodiments described above will be described.

For example, an overcurrent protection circuit disclosed in the present specification may include an overcurrent detection unit configured to compare an output current flowing through a switch element and a predetermined overcurrent detection value to generate an overcurrent detection signal, an output activation detection unit configured to compare an output voltage appearing on one end of the switch element and a predetermined threshold voltage to generate an output activation detection signal, a logic unit configured to combine the overcurrent detection signal and the output activation detection signal to generate a logic operation signal, and a diagnostic output unit configured to provide diagnostic output based on the logic operation signal. In the overcurrent protection circuit, the logic unit shifts the logic operation signal to a logic level of abnormal state when the overcurrent detection signal is shifted to a logic level of overcurrent detection state and holds the logic operation signal at the logic level of abnormal state even when the overcurrent detection signal is subsequently shifted to a logic level of overcurrent non-detection state, unless the output activation detection signal is shifted to a logic level of output activation state (first configuration).

In the overcurrent protection circuit according to the first configuration, the logic unit may further receive an input signal for turning on/off the switch element and shift the logic operation signal to a logic level of normal state regardless of the overcurrent detection signal and the output activation detection signal, when the input signal is at a logic level of off state (second configuration).

In the overcurrent protection circuit according to the second configuration, the overcurrent detection signal may be shifted to a high level when an overcurrent is detected, the overcurrent detection signal may be shifted to a low level when an overcurrent is not detected, the output activation detection signal may be shifted to a high level when output is activated, the output activation detection signal may be shifted to a low level when output is not activated, the input signal may be shifted to a high level during an on state, and the input signal may be shifted to a low level during an off state (third configuration).

In the overcurrent protection circuit according to the third configuration, the logic unit may include an inverter configured to logically invert the output activation detection signal to generate a first internal signal, a first logic product gate configured to perform an AND operation of the first internal signal and the logic operation signal to generate a second internal signal, a logic sum gate configured to perform an OR operation of the overcurrent detection signal and the second internal signal to generate a third internal signal; and a second logic product gate configured to perform an AND operation of the input signal and the third internal signal to generate the logic operation signal (fourth configuration).

In the overcurrent protection circuit according to any one of the first to fourth configurations, the diagnostic output unit may be in an open drain format (fifth configuration).

For example, a switch device disclosed in the present specification may include a switch element, and the overcurrent protection circuit according to any one of the first to fifth configurations that monitors an output current flowing through the switch element (sixth configuration).

In the switch device according to the sixth configuration, the switch element may be connected to a power supply terminal and an output terminal, and the output activation detection unit may shift the output activation detection signal to the logic level of output activation state when the output voltage appearing on the output terminal is higher than the threshold voltage (seventh configuration).

In the switch device according to the sixth configuration, the switch element may be connected to an output terminal and a ground terminal, and the output activation detection unit may shift the output activation detection signal to the logic level of output activation state when the output voltage appearing on the output terminal is lower than the threshold voltage (eighth configuration).

For example, an electronic apparatus disclosed in the present specification may include the switch device according to any one of the sixth to eighth configurations and a load connected to the switch device (ninth configuration).

For example, a vehicle disclosed in the present specification may include the electronic apparatus according to the ninth configuration (tenth configuration).

OTHER MODIFICATIONS

Although the in-vehicle high side switch LSI and low side switch LSI are illustrated in the embodiments, the overcurrent protection circuit disclosed in the present specification can be applied not only to these, but of course also to, for example, other in-vehicle IPDs (such as in-vehicle power supply LSI). The overcurrent protection circuit can also be widely applied to semiconductor integrated circuit apparatuses not for use in vehicles (for example, versatile power supply control circuit).

Various technical features disclosed in the present specification can be changed in various ways without departing from the scope of the embodiments and the technical creation of the embodiments. That is, the embodiments are illustrative in all aspects and should not be construed as restrictive. The technical scope of the present technology is indicated by the claims rather than the description of the embodiments, and it should be understood that all changes within the meaning and range of equivalents of the claims are included in the technical scope of the present technology.

What is claimed is:

1. An overcurrent protection circuit comprising:
an overcurrent detection unit configured to compare an output current flowing through a switch element and a predetermined overcurrent detection value to generate an overcurrent detection signal;
an output activation detection unit configured to compare an output voltage appearing on one end of the switch element and a predetermined threshold voltage to generate an output activation detection signal;
a logic unit configured to combine the overcurrent detection signal and the output activation detection signal to generate a logic operation signal; and
a diagnostic output unit configured to provide diagnostic output based on the logic operation signal, wherein
the logic unit shifts the logic operation signal to a logic level of abnormal state when the overcurrent detection signal is shifted to a logic level of overcurrent detection state and holds the logic operation signal at the logic level of abnormal state even when the overcurrent detection signal is subsequently shifted to a logic level of overcurrent non-detection state, unless the output activation detection signal is shifted to a logic level of output activation state.

2. The overcurrent protection circuit according to claim 1, wherein
the logic unit further receives an input signal for turning on/off the switch element and shifts the logic operation signal to a logic level of normal state regardless of the overcurrent detection signal and the output activation detection signal when the input signal is at a logic level of off state.

3. The overcurrent protection circuit according to claim 2, wherein
the overcurrent detection signal is shifted to a high level when an overcurrent is detected, the overcurrent detection signal is shifted to a low level when an overcurrent is not detected, the output activation detection signal is shifted to a high level when output is activated, the output activation detection signal is shifted to a low level when output is not activated, the input signal is shifted to a high level during an on state, and the input signal is shifted to a low level during an off state.

4. The overcurrent protection circuit according to claim 3, wherein
the logic unit includes
an inverter configured to logically invert the output activation detection signal to generate a first internal signal,
a first logic product gate configured to perform an AND operation of the first internal signal and the logic operation signal to generate a second internal signal,
a logic sum gate configured to perform an OR operation of the overcurrent detection signal and the second internal signal to generate a third internal signal, and
a second logic product gate configured to perform an AND operation of the input signal and the third internal signal to generate the logic operation signal.

5. The overcurrent protection circuit according to claim 1, wherein
the diagnostic output unit is in an open drain format.

6. A switch device comprising:
a switch element; and
the overcurrent protection circuit according to claim 1 that monitors an output current flowing through the switch element.

7. The switch device according to claim 6, wherein
the switch element is connected to a power supply terminal and an output terminal, and the output activation detection unit shifts the output activation detection signal to the logic level of output activation state when the output voltage appearing on the output terminal is higher than the threshold voltage.

8. The switch device according to claim 6, wherein
the switch element is connected to an output terminal and a ground terminal, and the output activation detection unit shifts the output activation detection signal to the logic level of output activation state when the output voltage appearing on the output terminal is lower than the threshold voltage.

9. An electronic apparatus comprising:
the switch device according to claim 6; and
a load connected to the switch device.

10. A vehicle comprising:
the electronic apparatus according to claim 9.

* * * * *